United States Patent [19]

Puddephatt et al.

[11] Patent Number: 4,714,627

[45] Date of Patent: Dec. 22, 1987

[54] METHOD OF GOLD DEPOSITION USING VOLATILE ORGANOGOLD COMPLEXES

[75] Inventors: Richard J. Puddephatt; Ilse Treurnicht, both of London, Canada

[73] Assignee: Ontario Development Corp., Ontario, Canada

[21] Appl. No.: 810,322

[22] Filed: Dec. 17, 1985

Related U.S. Application Data

[63] Continuation-in-part of Ser. No. 676,398, Nov. 29, 1984, abandoned.

[51] Int. Cl.$^4$ .................. B05D 3/06; C23C 16/06
[52] U.S. Cl. .................... 427/53.1; 427/124; 427/125; 427/252; 427/253; 427/255
[58] Field of Search ............ 427/53.1, 250, 252, 427/125, 124, 99, 91, 314, 255

[56] References Cited

U.S. PATENT DOCUMENTS

| | | | |
|---|---|---|---|
| 3,657,296 | 4/1972 | Vaughan | 427/250 |
| 3,661,959 | 5/1972 | Vaughan | 427/253 |
| 3,775,157 | 11/1973 | Fromson | 427/53.1 |
| 4,009,297 | 2/1977 | Redmond et al. | 427/252 |
| 4,526,807 | 7/1985 | Auerbach | 427/53.1 |

*Primary Examiner*—Sadie L. Childs
*Attorney, Agent, or Firm*—Ridout & Maybee

[57] ABSTRACT

A method is described for depositing gold onto a target surface using volatile organogold(I) and organogold-(III) complexes. The method requires the vaporization of the organogold complex under high vacuum and moderate temperature and introduction of the vaporized complex into contact with the target surface heated to a temperature at or above the decomposition temperature for the complex, so that the complex decomposes upon contacting the surface thereby depositing gold thereon. A number of new organogold complexes are described for use in the method.

13 Claims, No Drawings

METHOD OF GOLD DEPOSITION USING VOLATILE ORGANOGOLD COMPLEXES

This application is a continuation-in-part of application Ser. No. 06/676,398, filed on Nov. 29, 1984, now abandoned.

The present invention relates to a method for producing gold films of high purity from volatile organogold coordination compounds or complexes. These complexes are capable of causing the deposition of elemental gold under conditions of high vacuum and moderate heating. The invention also relates to certain new organogold coordination compounds which may be used in the method.

Because of gold's superior electrical conductivity and its very low chemical reactivity, it is widely used for electrical applications especially in the high technology electronics field. Presently, gold is deposited in a thin layer to form electrical circuits or contact points in a wide variety of electronic devices. Deposition may be accomplished electrochemically or physically by the technique of sputtering. Both of these deposition techniques are not wholly suitable for many high technology electronic applications such as those requiring the formation of microcircuits.

Metals have been painted on surfaces for decorative purposes since antiquity, and it has also been known that greater purity in the metal finish can be obtained if non-metallic moieties in the paint can be volatilized by baking the substrate. Certain organogold compounds that can be used in this way are disclosed by Vaughan in U.S. Pat. No. 3,657,296 dated Apr. 18, 1972. This approach of painting on organogold compounds in solution is not useful for microelectronics applications for the following reasons: (a) it is difficult to paint these solutions precisely on microcircuits and masking may be necessary; (b) a second step is added to the process since the circuitry must be heated to decompose the organogold compound and volatilize the organic moiety; (c) both the solvent vehicle and the adhesive materials used to create a painting solution, can leave impurities in the film unless they are also volatilized; (d) if high temperatures are needed to volatilize material other than gold metal, the circuit board itself may be damaged.

All of these limitations are evident in example 6 of the Vaughan U.S. patent. The solution mixture containing an organogold compound is required to be brushed on. The paint specified includes three separate metal resinates and a sulfurized gum damar in a vehicle with several additional compounds, all of which could contaminate the gold film. Firing at very high temperature (750° C.) is taught, and no analysis proving purity of the resulting finish is offered.

It is therefore understandable that other techniques are used. Sputtering of pure gold yields films of high purity but requires masking of the surface to protect areas that should not be plated. Gold on the masking must be reclaimed or waste will result. Electrolysis is the other major method used, but this too has limitations. The circuit board or other surface to be plated must be immersed in a gold-bearing electrolyte solution and a current passed through it. Precise deposition is again a problem and masking may be needed.

An improvement on the electrolysis method has been described by von Gutfeld et al., Appl. Phys. Lett., 43, 876 (1983). This method involves directing an argon laser beam through a lens onto a jetstream of gold-bearing electrolyte, resulting in gold deposits of good metallurgical quality without the need for masking.

The present invention also utilizes thermally enhanced plating. However, instead of using electroplating solutions, pure organogold complexes in the gas phase are employed as the source of metal. The organogold complexes are sublimed under reasonably high vacuum and moderate temperature, and can then be decomposed by a directed source of heat (such as a laser) onto a target surface. This plating procedure, therefore, provides a novel means of depositing pure gold with the potential for accurate microscale application.

Several constraints prevail in the choice of gold complexes suitable for these purposes:

(1) The organogold complex must be stable but at the same time volatile enough so that a sufficient vapor pressure can be obtained at moderate heating and high vacuum in order to give a high rate of plating.

(2) The organogold complex must decompose to elemental gold well below the critical temperature for damage to the electronic device being plated.

(3) The decomposition of the organogold complex should yield a pure form of elemental gold under these conditions. To this end the organogold complex must contain highly volatile organic moieties.

(4) While any heat source can be used, lasers have obvious utility for microscale applications since they offer a narrow heat beam. Lasers, however, only generate local temperatures of about 120° C. maximum in solution and no higher than 200° C. in vacuum. Therefore, a subset of organogold complexes should be found that allows decomposition and volatilization of organic moieties in this temperature range.

The invention includes the demonstration that know volatile organogold complexes can be utilized in this process, meeting criteria (1)–(3) or (1)–(4) above. The invention further describes novel volatile organogold complexes and demonstrates their application in this process, again meeting criteria (1)–(3) or (1)–(4).

The invention provides a general method for depositing gold onto a target surface, comprising the steps of: vaporizing an organogold complex under conditions of high vacuum and moderate heating, said complex having the formula:

or

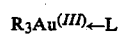

wherein

R may be an alkyl, alkenyl, alkynyl, aryl or aralkyl group having up to 12 carbon atoms; and L is a ligand which may be —CNR' or —PR''$_3$ where R' is a $C_{1-6}$ alkyl, or aryl or aralkyl group having up to 10 carbon atoms, and R'' is $C_{1-3}$ alkyl, or aryl;

heating the target surface also under high vacuum to at least the temperature of decomposition for the organogold complex; and introducing the vaporized complex into contact with the heated target surface while maintaining the high vacuum thereby causing decomposition of the complex and deposition of gold onto the target surface.

Particularly preferred conditions for the method include the use of a dynamic vacuum on the order of $10^{-2}$ mbar or better while heating the organogold complex in the range of 30°-80° C. The target surface is preferably heated in the range of 100°-250° C. with a range of 150°-200° C. being most preferred.

Probably the most commercially useful gold deposition from the vapor phase in accordance with the invention is provided by the more volatile of the organogold complexes defined above. These more volatile complexes yield a higher vapor pressure at moderate temperature and high vacuum, and thus a higher rate of plating once decomposition is induced. Generally, volatility increases as the size of the groups R and L is decreased. As a result, complexes such as methyl(isocyanomethyl)gold(I)  [AuMe(CNMe)]
methyl(trimethylphosphine)gold(I) [AuMe(PMe$_3$)]
trimethyl(trimethylphosphine)gold(III)  [AuMe$_3$(PMe$_3$)]

are of particular interest and have proved to be very useful for the process of vapor deposition of gold.

If increased size of the groups R and L is accompanied by markedly increased thermal stability of the organogold complex, such materials also have good potential as deposition vehicles. In such cases, the organogold complex can be heated to a higher temperature prior to decomposition, which compensates for the decreased volatility resulting from larger R and L groups.

These observations apply to the alkynylgold(I) complexes, including the novel materials 1-propynyl(isocyanomethyl)gold(I)  [Au—C≡C-Me(CNMe)]
3,3-dimethyl-1-butynyl(isocyanomethyl)gold(I) [Au—C≡CBu$^t$(CNMe)]
propynyl(trimethylphosphine)gold(I) [Au—C≡C-Me(PMe$_3$)]

Only a small number of reasonably stable yet volatile organogold complexes are known in the chemical literature. These include the simple compounds, [AuR(PR''$_3$)] and [AuR$_3$(PR''$_3$)], where R is a lower alkyl group such as methyl or ethyl and R'' is C$_{1-3}$ alkyl, or aryl (see for example, Schmidbaur et al., Chem. Ber., 104, 2821 (1971); Coates et al., J. Chem. Soc., 3220 (1962); ibid 421 (1963)).

The general class of organogold(I) complexes [AuR(CNR$_1$)], where R and R$_1$ are alkyl or aryl groups, are described by Vaughan in U.S. Pat. No. 3,657,296. Vaughan demonstrates the use of organoisocyanidegold complexes in forming gold films by applying solutions containing the complexes to substrates and subsequently heating the substrates to high temperatures to volatilize the organic moieties contained in the organogold complexes. The process disclosed in the present invention is radically different from the painting/firing processes as used since antiquity for decorative purposes and as also described by Vaughan. The examples cited in the Vaughan U.S. patent and in the chemical literature (Vaughan et al., J. Am. Chem. Soc., 91, 6151 (1969); Uson et al., J. Organomet. Chem., 173, 349 (1979)) contain substituted phenyl rings as R and R$_1$ in the compounds [R-Au-CNR$_1$]. As a result of these bulky ligands, the low volatility of the organoisocyanogold(I) complexes Vaughan uses as examples in preparing gold containing paints, would not be useful as vapor deposition vehicles.

The present invention utilizes in part a series of complexes of the class [AuR(CNR')], where R and R' are small hydrocarbon moieties. Of this series, [AuMe(CNMe)] being very volatile and relatively stable thermally, proved the most useful vapor deposition agent. The complexes containing larger R or R' groups do not show higher thermal stability to compensate for lower volatility. In fact, many members of this class such as [AuMe(CNEt)] (decompose 0° C.) and [AuMe(CN-ipropyl)] (decompose 40° C.), are not thermally stable enough to sublime quantitatively at room temperature (or, for that matter, to be prepared by the method of Vaughan). The two novel alkynylgold(I) complexes, [Au—C≡CMe(CNMe)] and [AuC≡CBu$^t$(CNMe)], did however show enhanced thermal stability.

All the complexes examined as potential vapor deposition agents were prepared by one general synthetic route. The procedure combines teachings of the chemical literature into a single step, represented as follows:

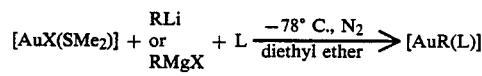

Standard Schlenk tube techniques were employed. The preparations involve suspension of [AuX(SMe$_2$)], X=Cl or Br, in dry diethyl ether under dinitrogen atmosphere, addition of an excess of the appropriate organolithium or Grignard reagent at −78° C., followed by addition of the organoisocyanide or organophosphorus ligand. The gold(I) products are isolated as white or pale yellow solids from the organic layers after hydrolysis, and can be recrystallized from hydrocarbon solvents such as acetone, diethyl ether or methylene dichloride.

The synthetic procedure can best be illustrated by specific examples.

EXAMPLE 1

Preparation of methyl(isocyanomethyl)gold(I)

1.0 g (2.95 mmol) [AuBr(SMe$_2$)] was suspended in 100 ml dry diethyl ether under nitrogen atmosphere. The mixture was stirred rapidly and cooled to −80° C. 5.0 ml (8.0 mmol) of 1.6M solution of MeLi in ether was added dropwise followed by 328 mg (8.0 mmol) MeNC. The reaction mixture was stirred and allowed to gradually warm to room temperature over 1 hour. Unreacted MeLi was hydrolyzed at 0° C. by the slow addition of 15 ml saturated NH$_4$Cl solution. The organic layer was separated and dried over MgSO$_4$, filtered and evaporated under reduced pressure at 0° C. to give 620 mg of white solid (74% yield).

NMR: δ3.21 [t,$^2J_{HN}$=1.9,3H,—CNCH$_3$] 0.295 [s, 3H,—Au—CH$_3$].

IR: ν (C≡N) 2240 cm$^{-1}$.

Mass Spec: m/e+253, 238, 197, 41.

mp: 95° decompose.

Additional specific examples of compounds of the invention are set out in Table 1.

EXAMPLE 2

Preparation of 3,3-dimethyl-1-butynyl(isocyanomethyl)gold(I)

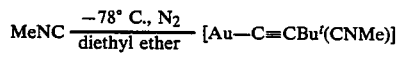

1.0 g (2.95 mmol) of [AuBr(SMe₂)] was suspended in 100 cm³ of dry diethyl ether under dinitrogen atmosphere.

adding 150 cm³ CH₂Cl₂ to the remaining milky water layer. Both organic layers were dried over MgSO₄, and filtered free of residual solids. The volatile components

TABLE 1

| COMPLEX | ¹H NMR δ(ppm), J(Hz) | IR $\nu(C{\equiv}N)(cm^{-1})$ | MASS SPECTRUM m/e+ |
|---|---|---|---|
| H₃C—Au—CNCH₂CH₃ | 0.250 [s, 3H, —Au—CH₃] | 2200 | 267,252,224,197,55 |
|  | 1.403 [m, 3H, —CN—CH₂CH₃] |  |  |
|  | 3.487 [m, 2H, —CN—CH₂—CH₃] |  |  |
| H₃C—Au—CNCH(CH₃)₂ | 0.297 [s, 3H, —Au—CH₃] | 2200 | 281,266,224,69,43 |
|  | 1.435 [dt, ³JHH = 6.61, |  |  |
|  | ³JHH = 2.53, 6H, —CNCH(CH₃)₂] |  |  |
|  | 3.851 [st, ³JHH = 6.64, |  |  |
|  | ²JHN = 1.87, 1H, —CNCH(CH₃)₂] |  |  |
| H₃C—Au—CNC(CH₃)₃ | 0.302 [s, 3H, —Au—CH₃] | 2200 | 295,280,253,239,224,69 |
|  | 1.492 [t, ³JHN = 2.24, |  |  |
|  | 9H, —CNC(CH₃)₃] |  |  |
| H₃C—Au—CNC₆H₅ | 0.343 [s, 3H, —Au—CH₃] | 2200 | 315,300,103 |
|  | 7.666 [m, 5H, —CNC₆H₅] |  |  |

Meanwhile, 1.0 cm³ (8.12 mmol) of 3,3-dimethyl-1-butyne was added at 0° C. to a 15 cm³ solution containing 7.5 mmol MeLi in diethyl ether. The latter mixture was warmed to room temperature, and after 15 minutes it was added dropwise to the suspension containing the organogold complex at −78° C. The reaction mixture was allowed to warm to room temperature over one hour. The excess lithiating reagent was hydrolyzed at 0° C. by slow addition of 15 cm³ of saturated ammonium chloride solution. The organic layer was separated and a second extraction of product with 100 cm³ diethyl ether was performed. The combined diethyl ether solutions were dried over magnesium sulfate and filtered free of residual solids. The volatile components were removed under reduced pressure at 0° C., yielding the product as a white crystalline solid in 79% yield.

Analytical data for [(CH₃)₃C—C≡C—Au—C≡NCH₃]: MW 319.156. MP 180°–181° C. (dec).

Elemental analysis: [C₈H₁₂AuN]: % C 30.11, % H 3.79, % N 4.39. Found: % C 29.85, % H 3.84, % N 4.07.

Infrared spectrum (CH₂Cl₂ solution): $\nu$ (C≡N) 2259 cm⁻¹. $\nu$ (C≡C) 2120 and 1923 cm⁻¹.

Mass spectrum (m/e+ at 80° C.) 319, 304, 238.

¹H NMR spectrum (XL200 in CD₂Cl₂, δ (ppm)): 1.179[s, 9H, —Au—C≡C—C(CH₃)₃] 3.337[t, ²JHN=2.48 Hz, 3H, —Au—C≡N—CH₃].

EXAMPLE 3

Preparation of 1-propynyl(trimethylphosphine)gold(I)

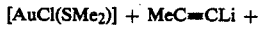

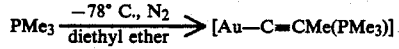

1-propyne gas was bubbled through a solution containing 6.8 mmol of MeLi in 15 cm³ dry diethyl ether at 0° C. under dinitrogen atmosphere. A white suspension of CH₃—C≡C—Li formed. This suspension was transferred dropwise into a reaction mixture containing 1.0 g (3.39 mmol) of [AuCl(SMe₂)] and 532 mgs (7.0 mmol) of PMe₃ at −78° C. in 100 cm³ dry diethyl ether. The reaction mixture was allowed to warm to room temperature over one hour. The excess lithiating reagent was hydrolyzed at 0° C. by slow addition of 15 cm³ saturated ammonium chloride solution. The diethyl ether layer was separated, and the product was further extracted by were removed under reduced pressure, and the resulting solid was recrystallized from CH₂Cl₂. The white product was obtained in 84% yield.

Analytical data for [CH₃—C≡C—Au—P(CH₃)₃]: MW 312.101. MP Decompose at 100° C.

Elemental analysis: [C₆H₁₂AuP]: % C 23.09, % H 3.88. Found: % C 23.32, % H 4.25.

Infrared spectrum (CH₂Cl₂ solution): $\nu$ (C≡C) region 2166, 2135, 2039, 1973 cm⁻¹.

Mass spectrum (m/e+ at 50° C.): 312, 273, 76.

¹H NMR spectrum (XL200 in CD₂Cl₂;δ (ppm)): 1.45[d, ²JPH=10.16 Hz, 9H, —Au—P(CH₃)₃], 1.829[s, 3H, —Au—C≡C—CH₃].

Several other known and novel volatile organogold(I) and oranogold(III) complexes were prepared in order to examine their potential as vapor deposition vehicles.

These include the organoisocyanogold(I) complexes [R-Au-CNR'], where R=methyl, phenyl, vinyl, propynyl and R'=methyl, ethyl, iso-propyl, tert-butyl, phenyl, cyclohexyl; and the trialkylphosphine derivatives [RAuP(R")₃], where R=methyl, phenyl, (methyl)₃, 3,3-dimethyl-1-butynyl and R"=methyl.

Analytical data for the new complexes of this group are set out in Table 2.

These, and the aforementioned volatile organogold complexes have potential application in the present invention to produce gold films. To repeat, this is achieved by vaporizing the volatile organogold complex under high vacuum and contacting the vapor with a target surface heated to at least the decomposition temperature of the organogold complex.

The following example is demonstrative of the general method for gold deposition according to the invention, although it is not intended to limit the scope of the invention in any way.

EXAMPLE 4

The decomposition of [AuMe(CNMe)] from the vapor phase to produce a gold film:

250 mgs of [AuMe(CNMe)] (mp 95° C. (dec)), was vaporized from a round-bottomed flask under dynamic vacuum (4×10⁻³ mbar), by gently heating the organogold complex to 30° C. The vapor of the organogold complex was passed along an elongated glass tube containing a predispositioned glass disk.

TABLE 2

| COMPLEX | $^1$H NMR δ (ppm), J(Hz) | IR | MASS SPECTRUM m/e+ |
|---|---|---|---|
| Me—Au—CNC$_6$H$_{11}$ (with cyclohexyl structure showing H$_A$, H$_B$, H$_C$, H$_D$) | 0.211 [s, 3H, —Au—CH$_3$]<br>1.426 [m, 4H, —Au—CNC$_6$H$_{11}$ (4H$_D$)]<br>1.741 [m, 4H, —Au—CNC$_6$H$_{11}$ (4H$_C$)]<br>1.919 [m, 2H, —Au—CNC$_6$H$_{11}$ (2H$_B$)]<br>3.732 [m, 1H, —Au—CNC$_6$H$_{11}$ (1H$_A$)] | ν (C≡N)(cm$^{-1}$)<br>2220 | 321,306,224,197,109 |
| CH$_2$=CH—Au—CNMe | 3.579 [t, not resolved, 3H, —Au—CNCH$_3$]<br>5.600 [dd, $^3$J(HH) trans = 20.7 Hz,<br>$^2$J(HH) gem = 5.0 Hz, 1H, —Au—CH=CHH]<br>6.079 [dd, $^3$J(HH) cis = 14.2 Hz, —Au—CH=CHH]<br>7.146 [dd, 1H, —Au—CH=CH$_2$] | | |
| CH$_2$=CH—Au—CNtBu | 1.445 [t, not resolved, 9H, —Au—CNC(CH$_3$)$_3$]<br>5.214 [dd, $^3$J(HH) trans = 20.7 Hz, $^2$J(HH)<br>gem = 5.1 Hz, 1H, —Au—CH=CHH]<br>5.683 [dd, $^3$J(HH) cis = 14.2 Hz, 1H, —Au—CH=CHH]<br>6.773 [dd, 1H, —Au—CH=CHH] | | |
| MeC≡C—Au—CNMe | 1.751 [s, 3H, —Au—C≡CCH$_3$]<br>3.544 [t, $^2$J(HN) = 2.65 Hz, 3H, —Au—CNCH$_3$] | ν(cm$^{-1}$)<br>(C≡N) and (C≡C)<br>2257,2305,<br>2145,2043,<br>1917 | 277,238,236,197,41 |
| tBuC≡C—Au—CNMe | 1.179 [s, 9H, —Au—C≡C—C(CH$_3$)$_3$]<br>3.337 [t, $^2$J(HN) = 2.5 Hz, 3H, —Au—C≡NCH$_3$] | 2259,2120,<br>1923 | 319,304,238 |
| MeC≡C—Au—PMe$_3$ | 1.485 [d, $^2$J(PH) = 10.16 Hz, 9H, —Au—P(CH$_3$)$_3$]<br>1.829 [s, 3H, —Au—C≡CCH$_3$] | 2166,2135,<br>2039,1973 | 312,273,76 |

The tube was heated by a furnace to 200° C. (i.e. above the decomposition temperature of the organogold compound). Decomposition of the organogold complex occurred upon passage of the vapor through the glass tube, resulting in the deposition of gold metal onto the heated target disk and onto the heated walls. The deposited gold film was peeled from the glass surface of the target disk, and the composition of the film was analyzed by X-ray photoelectron spectroscopy (XPS). The results for the deposition using [AuMe(CNMe)] are included in Table 3.

From the above example it is clear that any heat source capable of temperatures higher than the decomposition temperature of the organogold complex, can be used in preparation of gold films from volatile organogold complexes. Similarly, selective plating of the target disk can be achieved by selective heating of the target disk only. Any solid material capable of withstanding temperatures of about 150° C. can be plated in this way. This temperature can be lowered or raised depending on the decomposition temperature of the organogold complex and the volatility of the organic ligands it contains.

EXAMPLES 5-7

To further illustrate the use of volatile organogold complexes for preparing gold films by thermally enhanced plating as described in the present invention, three more examples are given. The decomposition of methyl (trimethylphosphine)gold(I) (example 5), trimethyl (trimethylphosphine)gold(III) (example 6) and 3,3-dimethyl-1-butynyl(trimethylphosphine)gold(I) (example 7) to prepare gold films were carried out using the same general procedure described in Example 4.

In all three cases the organogold complexes sublimed fast with moderate heating (40°-70° C.) under high vacuum (4×10$^{-3}$ mbar), and thus, high plating rates resulted as the organogold vapor came in contact with the heated target surface. The two alkyl phosphine derivatives (examples 5 and 6), proved particularly efficient, generating strong films within a short period of time.

TABLE 3

XPS ANALYSIS
Surface Composition Table

| Compound | Element | Atom % |
|---|---|---|
| (1) Sputtered Gold Standard | Au 4f | 64.19 |
| | C 1s | 22.42 |
| | O 1s | 11.42 |
| (2) [Au—CH$_3$(P(CH$_3$)$_3$)] | Au 4f | 71.22 |
| After bombarding 3 min Ar ions | C 1s | 28.78 |
| | Au 4f | 95.50 |
| | C 1s | 3.80 |
| | O 1s | 0.69 |
| (3) [Au(CH$_3$)$_3$(P(CH$_3$)$_3$)] | Au 4f | 65.61 |
| After bombarding 3 min Ar ions | C 1s | 32.81 |
| | O 1s | 1.59 |
| | Au 4f | 95.32 |
| | C 1s | 4.68 |
| (4) [AuCH$_3$(CNCH$_3$)] | Au 4f | 52.93 |
| | C 1s | 36.81 |
| | O 1s | 5.25 |
| | N 1s | 5.01 |
| (5) [Au—C≡C—C(CH$_3$)$_3$(P(CH$_3$)$_3$)] | Au 4f | 37.64 |
| | C 1s | 59.70 |
| | O 1s | 2.66 |

The thickness of the gold film formed as a result of vapor deposition can be varied and depends on the deposition time and on the vapor pressure achieved by the specific organogold complex under the experimental conditions employed. In the above three examples, even the very thin films proved robust enough to be cut manually.

The composition analyses for the gold films prepared using the cited three trimethylphosphine derivatives, are also listed in Table 3. In order to evaluate the data obtained for the gold films prepared by vapor deposition from volatile organogold complexes as described in this invention, the composition analysis for a sputtered pure gold standard is also included in Table 3. The exposure of pure gold films to the atmosphere results in immediate coating of the films with carbon and oxygen impurities. The gold films can be cleaned by bombarding the surfaces with argon ion beams, resulting in a drastic drop in the percentage impurities adsorbed on the surface. This is illustrated in Table 3 for the films prepared using [AuMe(PMe$_3$)] and [AuMe$_3$(PMe$_3$)]. The residual carbon is simply a function of the vacuum limits of the XPS system.

The above results clearly indicate the very high metallurgical purity of the gold films prepared by vapor deposition of volatile organogold complexes according to the invention.

EXAMPLE 8

To illustrate the use of this method for coating semiconductor materials such as silicon or gallium arsenide, a further example is described. The same method was used as in example 4 except that a silicon disk was used in place of the glass disk. Gold film was formed selectively on the silicon disk rather than on the surrounding glass. The purity of the gold was confirmed by elemental surface composition analysis in the usual way.

We claim:

1. A method for depositing gold onto a target surface, comprising:

vaporizing an organogold complex under conditions of a dynamic vacuum of at least about $10^{-2}$ mbar and moderate heating in the range of about 30° C. to about 80° C., said complex having the formula:

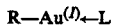

or

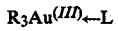

wherein R may be an alkyl, alkenyl, alkynyl, aryl or aralkyl group having up to 12 carbon atoms; and L may be —CNR′ or —PR″$_3$ wherein R′ is a C$_{1-6}$ alkyl, or an aryl or aralkyl group having up to 10 carbon atoms, and R″ is a C$_{1-3}$ alkyl, or aryl;

heating the target surface also under a dynamic vacuum of at least about $10^{-2}$ mbar to at least the temperature of decomposition for the organogold complex, said heating being in the range of about 100° C. to about 250° C.; and introducing the vaporized complex into contact with the heated target surface while maintaining the vacuum thereby causing decomposition of the complex and deposition of gold onto the target surface.

2. A method as claimed in claim 1, wherein the target surface is heated by means of a laser beam.

3. A method as claimed in claim 1, wherein the organogold complex is methyl(isocyanomethyl)gold(I).

4. A method as claimed in claim 1, wherein the organogold complex is 3,3-dimethyl-1-butynyl-(isocyanomethyl)gold(I).

5. A method as claimed in claim 1, wherein the organogold complex is 1-propynyl(trimethylphosphine)-gold(I).

6. A method as claimed in claim 1, wherein the organogold complex is trimethyl(trimethylphosphine)-gold(III).

7. A method as claimed in claim 1, wherein the organogold complex is methyl(trimethylphosphine)-gold(I).

8. A method as claimed in claim 1, wherein the organogold complex is 3,3-dimethyl-1-butynyl(trimethylphosphine)gold(I).

9. A method as claimed in claim 1, wherein the organogold complex is 1-propynyl(isocyanomethyl)-gold(I).

10. A method as claimed in claim 1, wherein the organogold complex is vaporized under a dynamic vacuum of about $10^{-3}$ mbar, with heating thereof in the range 40°–70° C., and the target surface being heated in the range 150°–200° C.

11. A method as claimed in claim 1, wherein the organogold complex is methyl(isocyanocyclohexyl)-gold(I).

12. A method as claimed in claim 1, wherein the organogold complex is vinyl(isocyanomethyl)gold(I).

13. A method as claimed in claim 1, wherein the organogold complex is vinyl(isocyanotert-butyl)-gold(I).

* * * * *